United States Patent
Yabusaki et al.

(10) Patent No.: US 6,847,055 B2
(45) Date of Patent: Jan. 25, 2005

(54) SEMICONDUCTOR DEVICES, AND METHODS OF MANUFACTURE OF THE SAME

(75) Inventors: Keiichi Yabusaki, Tokyo (JP); Michio Ohkubo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/695,814

(22) Filed: Oct. 30, 2003

(65) Prior Publication Data

US 2004/0084685 A1 May 6, 2004

Related U.S. Application Data

(62) Division of application No. 10/003,748, filed on Oct. 23, 2001, now abandoned.

(30) Foreign Application Priority Data

Dec. 27, 2000 (JP) .......................... 2000-399425

(51) Int. Cl.$^7$ .............................................. H01L 33/00
(52) U.S. Cl. .......................................... 257/94; 257/99
(58) Field of Search ............................................ 257/94

(56) References Cited

U.S. PATENT DOCUMENTS 5,260,588 A * 11/1993 Ohta et al. ..................... 257/93

* cited by examiner

*Primary Examiner*—Douglas Wille
(74) *Attorney, Agent, or Firm*—Oblon, Spivak, McClelland, Maier & Neustadt, P.C.

(57) ABSTRACT

The semiconductor laser device has the lower clad layer, active layer, upper clad layer, contact layer, the insulating film, and the positive electrode sequentially formed on the semiconductor substrate. The upper clad layer, the contact layer and the insulating film form the ridge. The positive electrode covers the upper and side faces of the ridge. The thickness of the positive electrode on the upper and side faces of the ridge is preferably substantially the same and it is not less than 150 nm.

12 Claims, 13 Drawing Sheets

PLASMA ASHING

PLASMA ETCHING

SEMICONDUCTOR DEVICES, AND METHODS OF MANUFACTURE OF THE SAME

FIELD OF THE INVENTION

The present invention relates to semiconductor devices having a ridge structure, such as the ridge-type semiconductor laser devices. The ridge structure may be formed on top of a surface of a substrate, or within a surface of a substrate, as in the case of double channel semiconductor devices, such as Double Channel Planar Buried Heterostructures.

BACKGROUND OF THE INVENTION

Conventionally, semiconductor devices having desired electric circuitry or desired electric elements have been formed by forming a multi-layer film structure on a semiconductor substrate and then performing etching or the like.

FIG. 5 is a sectional view of a conventional semiconductor laser device which is an example of a semiconductor device. This semiconductor laser device has the ridge 12' in a stripe shape, and light and electric current are confined by this ridge 12'. As a result, this semiconductor laser device exhibits good lasing ability with a simple structure, and is used in various fields such as optical communication, optical recording and measurements, for light-emitting devices and optical fiber amplifier excitation apparatus.

This semiconductor laser device has the lower clad layer 3, active layer 4, upper clad layer 5, contact layer 9 and insulating film 6 sequentially formed on the upper face of semiconductor substrate 2. A part of the upper clad layer 5, contact layer 9 and the insulating film 6 together form ridge 12'. Moreover, the negative electrode 1 is formed on the lower face of the semiconductor substrate 2, and the positive electrode 17 is formed on the upper face of the semiconductor laser device.

This conventional semiconductor laser device is manufactured with a method that is shown in FIGS. 6A to 6C and FIGS. 7A to 7C. As shown in FIG. 6A, the lower clad layer 3, active layer 4, upper clad layer 5 and the contact layer 9 are sequentially formed on one surface of the semiconductor substrate 2. Then, the resist 10 is applied to form a film on the contact layer 9.

Thereafter, as shown in FIG. 6B, the contact layer 9 and the upper clad layer 5 are etched by to thereby form the ridge 12' having the same width as that of the resist 10. Subsequently, as shown in FIG. 6C, the resist 10 is removed, and the insulating film 6 is formed on the exposed surfaces of the upper clad layer 5 and the contact layer 9. Thus, the insulating film 6 completely covers the ridge 12'.

Subsequently, as shown in FIG. 7A, the resist 11 is applied on the insulating film 6. This resist 11 is applied in such a manner that it covers the ridge 12'. Although not shown in the drawing, another resist is formed above the resist 11 thereby making the surface above the ridge 12' and its periphery flat. Thereafter, as shown in FIG. 7B, photo-lithography and oxygen plasma ashing processing are performed thereto, to remove the resist 11 on the upper face of the ridge 12' and the peripheral portion thereof, up to the height of the insulating film 6 of the ridge 12', to thereby expose the insulating film 6 on the upper face of the ridge 12'.

Subsequently, as shown in FIG. 7C, the insulating film 6 on the upper face of the ridge 12' is removed by plasma etching processing, to thereby expose the contact layer 9. Then, the resist 11 is completely removed, and the positive electrode 17 (see FIG. 5) is deposited on the entire upper face including the side of the ridge 12'. Next, the thickness of the substrate is reduced by milling and polishing the lower face of the substrate. Finally, the negative electrode 1 (see FIG. 5) is deposited on the lower face of the semiconductor substrate 2. Thus, the conventional ridge-type semiconductor laser device is obtained.

The positive electrode 17 is typically formed using several photolithographic steps, a dry deposition step, and a plating step. Specifically, a first photolithographic step is used to form a lift-off mask which does not cover the area where electrode 17 is to be formed. This step typically includes the step of using an ionic developer solution (e.g., alkaline solutions such as NaOH, KOH, and tetra-methyl-ammonium hydroxide, TMAH) to develop a pattern in the lift-off mask. Next, a dry deposition process (e.g., sputtering) is used to deposit a thin metallic adhesion layer, followed by a thin metallic barrier layer which resists the diffusion of gold into the adhesion layer. The portions of the metal layer that are formed on the lift-off mask, which are not wanted in the finished device, are removed by a second photo-lithographic step which removes the underlying lift-off mask by exposing it to an organic solvent (e.g., washing it in the solvent).

Next, a thin gold seed layer for a subsequent electroplating step is usually deposited over the surface of the wafer. However, this step can be omitted if gold can be directly electroplated onto the barrier layer. A third photo-lithographic step is then used to form a patterned plating mask over the surface of the substrate such that the top of electrode 17 is exposed. This photo-lithographic step includes the use of an ionic developer solution to develop a pattern in the plating mask layer. Next, a thick layer of gold is typically plated over the top of electrode 17 using an ionic plating solution and the plating mask. Then the plating mask is removed by washing in an organic solvent (a fourth photo-lithographic step). If desired, a brief exposure to a gold etchant can be used to remove the seed layer which was previously covered by the plating mask.

Similar steps are used to form the negative electrode 1, including exposure to one or more ionic developer solutions and one or more organic solvents. The milling process used to thin the substrate also uses organic solvents, and may sometimes use ionic developer solutions.

In the conventional semiconductor laser device, however, when the positive electrode 17 and the negative electrode 1 are formed using the photolithography and plating steps described above, there often occurs an erosion of the contact layer 9. When the contact layer 9 is eroded, the current channel of the obtained semiconductor laser device becomes narrow and thereby the electric resistance increases. As a result, there is a drawback that the optical output of the semiconductor laser device decreases. If the erosion is severe, most of the contact layer 9 and the upper clad layer 5 are affected, thereby the optical output further decreases.

As part of making their invention, the inventors have found that the plasma etching process shown in FIG. 7C causes the top edges of insulating film 6 to have inclined surfaces 23 instead of flat surfaces, as shown in FIG. 8, and as shown in an enlarged view in FIG. 11. The inclined surfaces 23 create small gaps 24 between insulating film 6 and contact layer 9 of the ridge, which create discontinuities in the surface over which electrode layer 17 is deposited. With experiments on several samples conducted as part of making their invention, the inventors, the inventors have further found that an erosion 22 is observed near the upper portion of the contact layer 9 near these small gaps 24. They have also found that a crack 21 extending all the way through the electrode layer 17 is generally observed near the erosion 22 at the boundary between the positive electrode 17 and the insulating film 6. This is shown at the left side of the device in FIG. 8. We have shown on the right side of the device of FIG. 8 the case where the crack does not extend all the way through the electrode layer. Although FIG. 8 shows the erosion 22 only on the left side of the semiconductor laser device, similar erosion is observed on the right side as well.

Moreover, as part of making their invention, the inventors have found that the ionic solutions used during the photolithography and plating steps infiltrates to the contact layer 9 via the crack 21 and erodes the contact layer 9 due to electrochemical reaction.

The present invention is focused on reducing, and preferably eliminating, this undesirable erosion.

SUMARY OF THE INVENTION

It is an object of the present invention to provide semiconductor devices which do not have cracks in their positive electrodes or erosion of their contact layers. It is another object of this invention to provide methods by which such semiconductor devices can be manufactured easily and efficiently.

A fist invention of the present application provides a novel shaped ridge structure which substantially reduces, and in most cases eliminates, the small gaps between the insulating film and the ridge which cause the above-described discontinuities. An exemplary ridge according to this invention comprises at least one layer of a semiconductor material, and has a base attached to a surface of a substrate, an upper face located above the base, a first body section located between the base and the upper face, a second body section located between the first body section and the upper face, and at least one side face located between the ridge's upper face and the base and to one side of the first and second body sections. The side face has a first area which spans over the first body section and a second area which spans over the second body section. The side face further has a straight mesa slope or a forward mesa slope in the first area and a reverse mesa slope in the second area. The exemplary ridge further comprises a dielectric layer disposed on the first side face and covering the first area, the second area, and preferably the upper face of the ridge prior to the application of the plasma etching step. After the plasma etching process, the portion of the dielectric layer covering the upper face is substantially removed, and a portion of the dielectric layer which covers the second area near the upper surface is substantially removed in a manner that provides a relatively smooth surface. In a preferred embodiment, the material of the ridge is more resistant to plasma etching than the material of the dielectric layer.

A second invention of the present application may be used with the first invention of the present application or separate therefrom. An exemplary ridge according to this invention comprises at least one layer of a semiconductor material, and has a base attached to a surface of a substrate, an upper face located above the base, and at least one side face located between the ridge's upper face and the base. The exemplary ridge further comprises a conductive layer disposed on at least a portion of the ridge such that the conductive layer covers the at least one side face of the ridge with a first thickness ($T_1$) at the ridge portion, and further covers the ridge's upper face with a second thickness ($T_2$) at the ridge portion. The first thickness of conductive material on the side face is significantly thicker than that used in conventional devices, being equal to or greater than 150 nm, and/or equal to or greater than fifty percent of the second thickness. The larger thickness can be achieved in a dry deposition process by tilting the ridge and its supporting substrate with respect to the flow direction of deposition material and by rotating the substrate around a surface normal of the substrate during the dry deposition process. The greater than normal thickness of conductive material on the ridge's side face resists the occurrence of cracks in the conductive material.

Other objects and features of this invention will become apparent from the following description with reference to the accompanying drawings.

DETAILED DESCRIPTION OF THE EMBODIMENTS

An exemplary semiconductor device which incorporates both inventions of the present application, and exemplary methods thereof, are described below with reference to the accompanying drawings.

Figure 1:
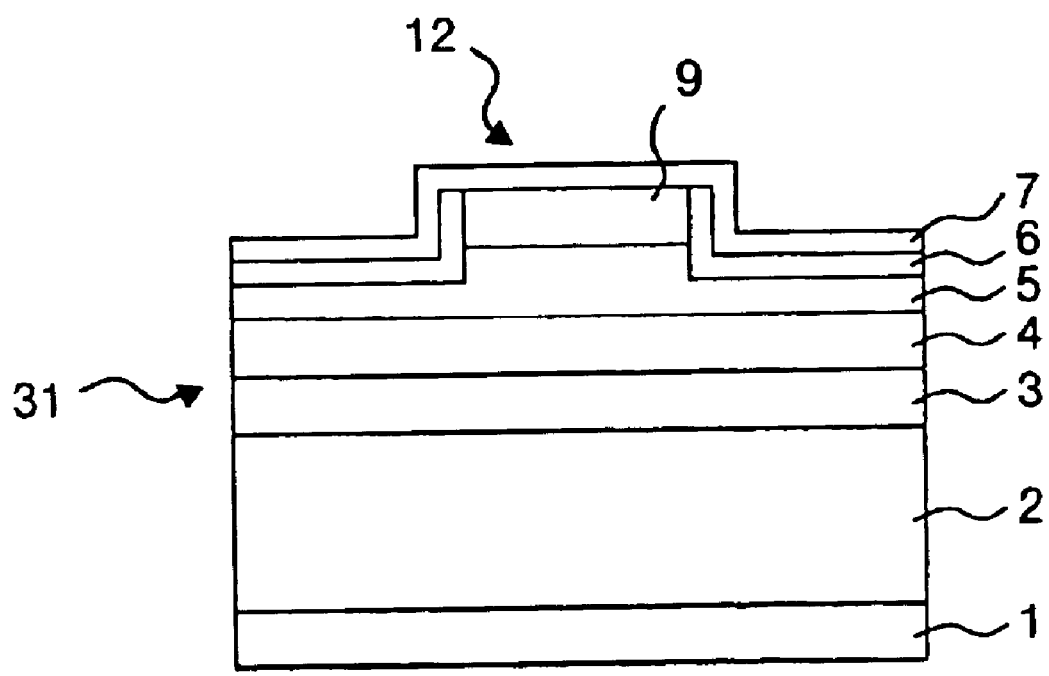
FIG. 1 is a sectional view of a semiconductor laser device, being one embodiment of the first and second inventions of the present application.
Figure 4A:
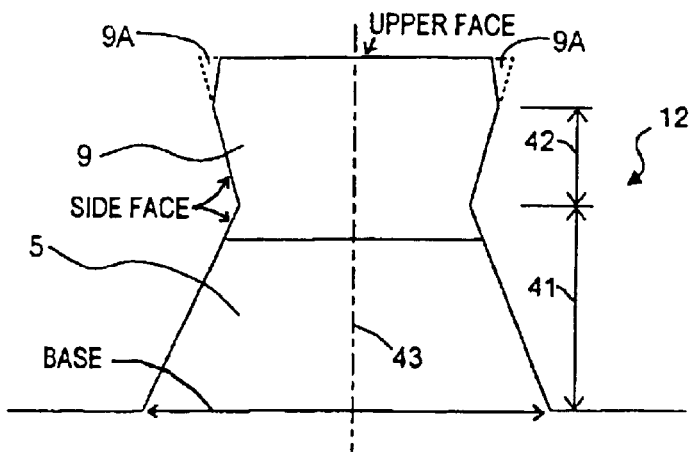
FIGS. 4A–4B are enlarged sectional views of a ridge portion of the semiconductor laser device under selected stages of manufacture according to the first invention of the present application.
Figure 4B:
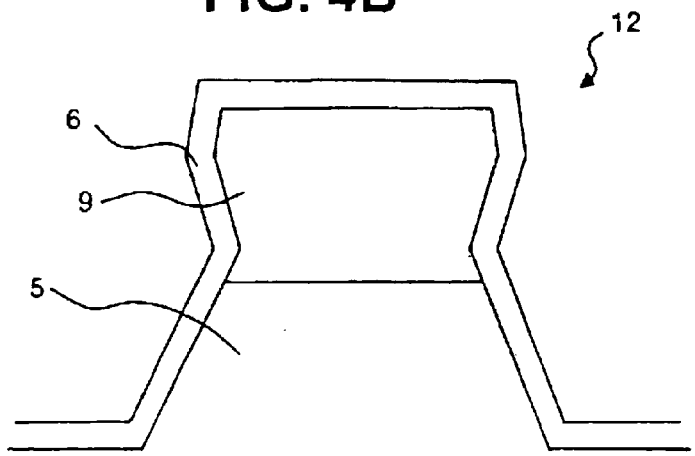
Figure 4C:
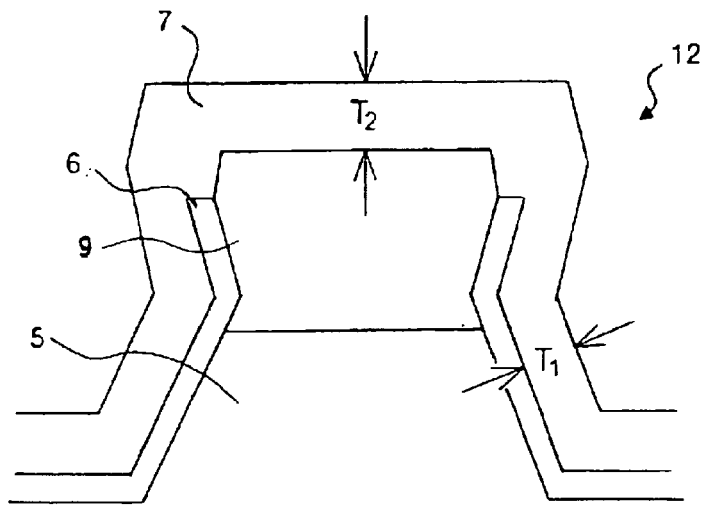
FIG. 4C is an enlarged sectional view of the ridge portion of the semiconductor laser device after completion of manufacture according to both the first and second inventions of the present application.
Figure 5:
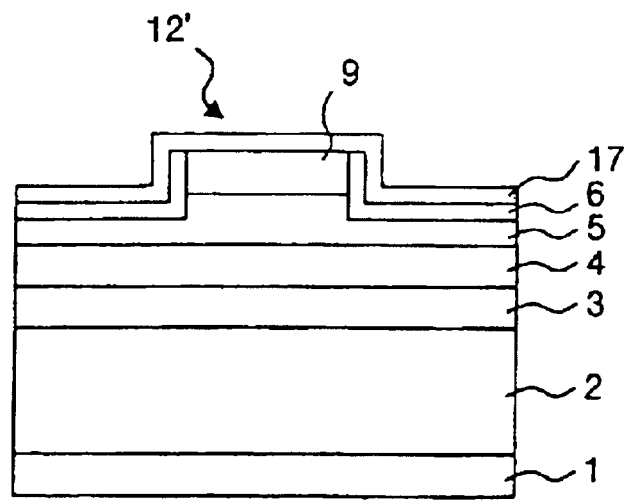
FIG. 5 is a sectional view of a semiconductor laser device which is an example of a conventional semiconductor device according to the prior art.

FIG. 1 is a general sectional view of the semiconductor laser device according to one embodiment of the present inventions, and FIG. 4C is an enlarged view of the ridge section 12 thereof. Referring to FIG. 1, a multi-layer film substrate 31 forming this semiconductor laser device has a lower clad layer 3, an active layer 4, an upper clad layer 5, a contact layer 9, and an insulating film 6 (i.e., insulating layer) formed on one surface of the semiconductor substrate 2. The upper clad layer 5, the contact layer 9 and the insulating film 6 together form a ridge 12. In addition, a negative electrode 1 is formed on the other surface of the semiconductor substrate 2, and a positive electrode 7 is formed above the multi-layer film substrate 31.

Figure 2A:
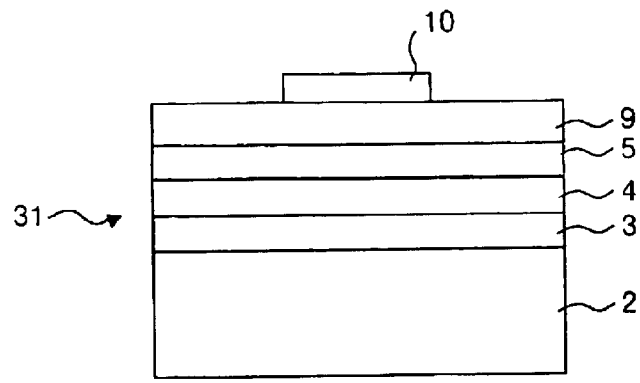
FIG. 2A to FIG. 2C are sectional views showing the manufacturing process of the semiconductor laser device shown in FIG. 1 according to the first invention of the present application.

The semiconductor laser device is manufactured with a process that will be explained with reference to FIG. 2A to FIG. 2C, FIG. 3A to FIG. 3C, and FIG. 4A to FIG. 4C. As shown in FIG. 2A, the lower clad layer 3 having a composition of n-type AlGaAs, the active layer 4, the upper clad layer 5 having a composition of p-type AlGaAs, and the contact layer 9 preferably having a composition of p-type GaAs, are sequentially formed on the top surface of the semiconductor substrate 2 having a composition of n-type GaAs. The various layers may be formed using the thin-film epitaxial growth method such as the MOCVD or MBE method. A resist 10 is then applied to form a film on the contact layer 9.

Figure 2B:
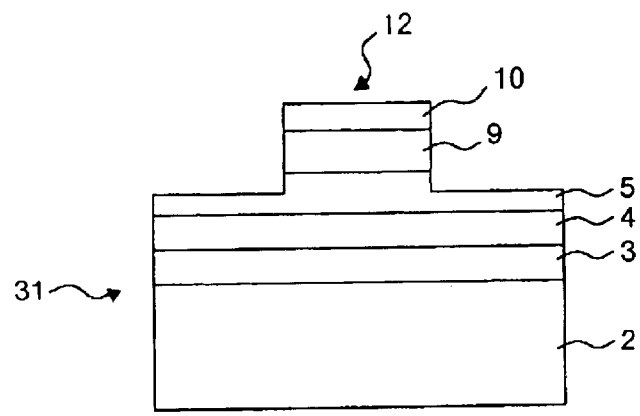
Figure 2C:
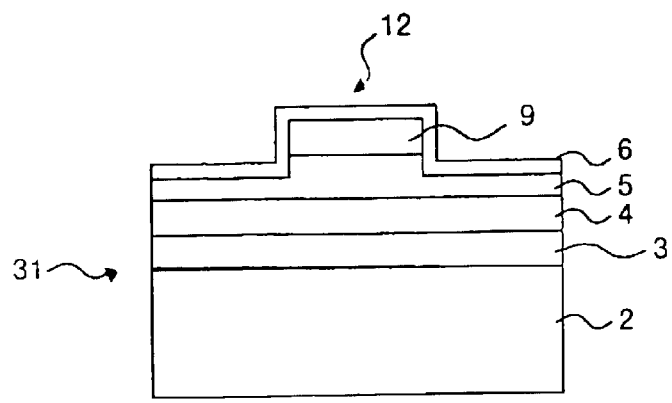

Thereafter, as shown in FIG. 2B, the contact layer 9 and the upper clad layer 5 are etched by wet etching processing using the citric acid type solution to thereby form the ridge 12 having the same width as that of the resist 10.

Subsequently, the resist 10 on the upper face of the multi-layer film substrate 31 is removed by dissolving it using a stripping solution and the resists 10 is then completely removed by the oxygen plasma ashing processing. FIG. 4A shows an enlarged cross-section view of the ridge after the completion of these steps. As indicated in FIG. 4A, the ridge has a base attached to the substrate, an upper face located above the base, and side faces located between the ridge's upper face and the base. As can be seen in the figure, the side faces essentially have an "hourglass" shape which divides the body of the ridge into two major sections: a lower body section 41 and an upper body section 42. The side faces at the lower body section 41 have "forward mesa" slopes, meaning that one moves forward as one climbs up the side face from the bottom of the ridge. A more precise definition of "forward mesa slope" is that the upper end of the sloped face is closer to the central line 43 of the ridge than the lower end of the sloped face. The side faces at the upper body section 42 have "reverse mesa" slopes, meaning that one moves backwards (in the reverse direction) as one climbs up the sloped side face. A more precise definition of "reverse mesa slope" is that the upper end of the sloped face is further away from the center line 43 of the ridge than the lower end of the sloped face. The upper edges of the ridge (i.e., the upper edges of body section 42) are rounded over by the step of removing resist layer 10 by stripping and oxygen plasma ashing processing, and thus portions 9A of contact layer 9 are removed. The slopes of the side faces at removed portions 9A may be straight or "forward mesa" sloped. In this case, second body section 42 does not extend all the way to the upper face of the ridge.

The hourglass shaped ridge is achieved with citric acid etching solution acting on the following composition of ridge 12: contact layer 9 composed of p-type GaAs, and having a thickness of 400 nm; upper clad layer 5 composed of p-type $Al_{0.3}Ga_{0.7}As$ and having a thickness of 1400 nm (1.4 $\mu$m) to 1500 nm (1.5 $\mu$m). With a citric acid etching solution and this selection of materials, there is a difference between the etching speed of the contact layer 9 and the etching speed of the upper clad layer 5 which creates the forward mesa slope at the lower body section 41 and a reverse mesa slope at the upper body section 42. Thus, the first invention of this application is applied to this exemplary semiconductor device.

As the next step in the exemplary manufacturing method, the insulating film 6 is formed on the upper face of the multi-layer film substrate 31, using the plasma CVD method or the like. This insulating film 6 is formed on the upper face of the upper clad layer 5, on the upper face of the ridge 12 and on the side of the ridge 12. The insulating film 6 may be a silicon nitride film, and has a thickness of approximately 120 nm in this example. The result of this step is shown generally in FIG. 2C, and in an expanded view in FIG. 4B.

Figure 3A:
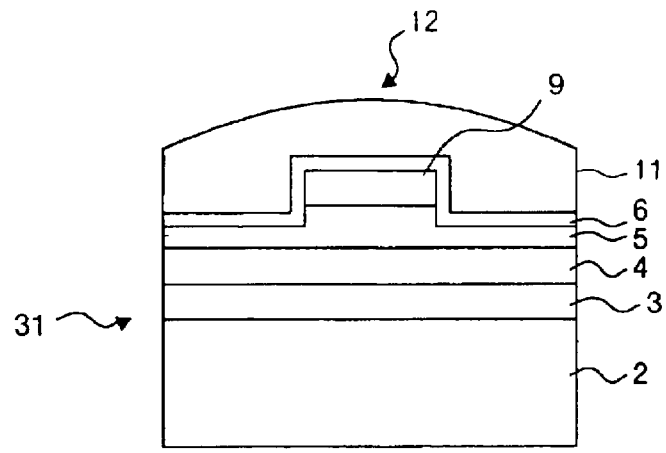
FIG. 3A to FIG. 3C are sectional views showing continuation of the manufacturing process of the semiconductor laser device shown in FIG. 1 according to the first invention of the present application.

Subsequently, as shown in FIG. 3A, the resist 11 is formed above the ridge 12 in such a manner that the resists rises above the ridge 12 in height. A spin coat process or the like is used for application of the resist 11.

Figure 3B:
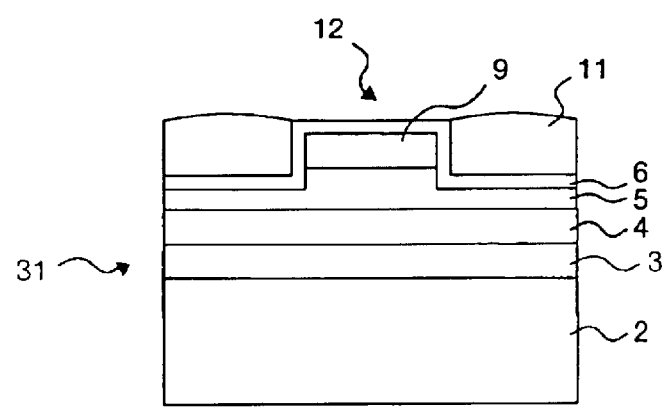

Subsequently, as shown in FIG. 3B, a portion of the resist 11 is removed by the photolithography and oxygen plasma etching processing. The etching processing is controlled in such a manner that the etching stops when the insulating film 6 above the ridge 12 gets exposed.

Figure 3C:
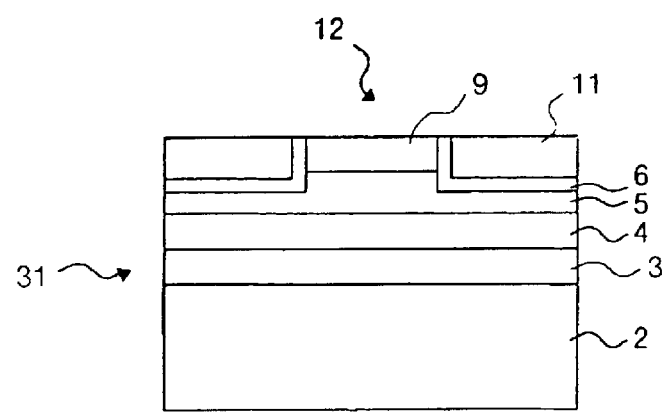

Thereafter, for example, as shown in FIG. 3C, FREON-gas plasma etching processing is performed to remove the insulating film 6 on the upper face of the ridge 12. The etching process is controlled in such a manner that the etching stops when the contact layer 9 is exposed, with a small amount of over-etching. The thickness of the resist 11 at this stage is from 1.6 $\mu$m to 1.8 $\mu$m, as measured from the top of layer 6 (in the area away from the ridge), and is from 1.8 $\mu$m to 2 $\mu$m, as measured from the top of layer 5 (in the area away from the ridge). Therefore, the resist 11 substantially serves as a protective cover for the portions of the insulating film 6 which are not to be removed, when etching the insulating film 6 on the upper face of the ridge 12. However, a small portion of layer 6 is removed from the top of the side faces of the ridge, generally approximately 100 nm down from the upper face of the ridge (looking ahead to FIG. 4C, it can be seen that the top of layer 6 on the side face is somewhat below the top of the ridge's upper face). As will be described in greater detail below, the etching of layer 6 with the reverse mesa slope at the upper end of the ridge provides the advantageous effect of allowing a significant amount of over-etching without creating large discontinuities in the surface of the side face, as can be the case in the prior art.

The resist 11 is then dissolved and removed using a stripping solution (e.g., organic solvent), and the oxygen plasma ashing processing is applied to thereby remove the remaining resist 11. As the stripping solution, one containing aromatic hydrocarbon, phenol and alkyl benzene sulfonate at a ratio of 6:2:2 may be used.

Next, the positive electrode 7 (see FIG. 1) having a thickness of 200 nm is formed on the exposed face of the contact layer 9 and on the insulating film 6, using the photolithography lift-off technique and a dry deposition process, such as metal evaporation, metal sputtering (e.g., collimated sputtering), etc. In the lift-off technique, a photoresist layer (usually having a thickness of 2 microns or more) is formed over the top surface of the substrate, and then patterned to remove photoresist material in those locations where the positive electrode 7 is to be formed. In this example, the photoresist material is removed over the top and side faces of the ridge. The conductive material for electrode 7 is then deposited over the entire top surface of the substrate, including the top surfaces of the patterned photoresist layer and the top and side faces of the ridge, preferably with a dry deposition process. Unwanted metal is deposited over the photoresist layer. The photoresist is subsequently removed with a stripping solvent, which lifts the unwanted metal away from the substrate, leaving behind the desired metal pattern. The stripping solution is generally an organic solvent. The deposited conductive layer for electrode 7 generally comprises a first sublayer of an adhesive metal (such as titanium—Ti) with a thickness of at least 75 nm, and a second sublayer of a gold-diffusion barrier layer (such at platinum—Pt) with a thickness of at least 75 nm. As described below in greater detail, a thick gold layer will be subsequently formed over electrode 7 by electroplating, and the barrier sub-layer prevent gold interacting with the adhesion sub-layer. In preferred embodiments, both the adhesion sublayer and the barrier sublayer preferably comprise substantially no gold (Au), each comprising not more than 5% of gold by weight, and preferably not more than 0.5% by weight. The dry deposition process preferably provides each sub-layer with a lustrous surface morphology, as opposed to the non-lustrous surface morphology obtained with conventional plating processes used in the electronics industry.

The dry deposition process may be performed by a vapor deposition apparatus or a sputtering apparatus (such as with a collimator), or the like, all of which are generically referred to as dry deposition apparatuses herein. The dry deposition apparatus comprises a deposition axis along which deposition material flows in low pressure gaseous environment (e.g., near vacuum), and a holder for holding a substrate within the deposition field of the apparatus. The holder is capable of revolving about a center axis of the holder, this center axis being substantially parallel to a normal vector of the top surface of the substrate which is held by the holder. The holder is oriented within deposition field such that its center axis is inclined with respect to the deposition axis (i.e., the center axis and the deposition axis form a non-zero acute angle.) This configuration enables the thickness of the electrode on the upper face and the thickness on the side face of the ridge 12 to be made substantially the same. Accordingly, the multi-layer film substrate 31 with ridge 12 is placed within the holder, and the holder is set with its center line at an incline, and is rotated within the deposition field during the deposition process. As a result, electrode material is adhered to the upper and side faces of the ridge 12 and the lower surfaces of layer 6, to form the positive electrode 7. In this manner, electrode 7 is formed to a thickness of at least 150 nm, and more preferably of at least 200 nm, without being exposed to an ionic solution (e.g., developer, plating solution), an organic solvent, or other liquid.

Next, the positive electrode 7 is then plated with a thick layer of gold (Au), such as by using the steps previously described for the prior art device. Those steps including using an aqueous ionic developer solution to define a pattern in the plating mask, and using an aqueous ionic plating solution to plate gold material. Each of these ionic solutions contacts the metal electrode 7, and has the potential of eroding portions of the ridge if they infiltrate through the electrode 7. However, the thickness of electrode 7 on the side faces of the ridge as taught by the present invention substantially prevents the occurrence of the infiltration and the occurrence of the erosion.

Gold is a more ductile material and softer material than the materials used for the sublayers of electrode 7. (Stated the other way, the materials used for the sublayers of electrode 7 are less ductile and harder than gold). In bulk crystalline form, gold has a hardness of approximately 25 on the Vicker's scale, platinum has a hardness of approximately 40, and titanium has a hardness of approximately 60. Values for these materials in the form of deposited films will vary somewhat from the values in bulk crystalline form, but the relative ordering of the values is substantially the same. In preferred embodiments, the sublayers of electrode 7 which provide the first 150 nm of the electrode's thickness on the side face (as measured from the interface with the ridge) are preferably comprised of materials having hardness values of 30 or more on the Vicker's scale (and as measured in their bulk crystalline form), and 60 or less on the Vicker's scale.

Next, the lower face of the semiconductor substrate 2 is milled and polished, and then the negative electrode 1 is formed thereon. Similar steps are used to form the negative electrode 1, including exposure to one or more ionic developer solutions and one or more organic solvents. The milling process used to thin the substrate also uses organic solvents, and may sometimes use ionic developer solutions.

The result of these steps is shown generally in FIG. 1, and in an expanded cross-sectional view in FIG. 4C.

The multi-layer film substrate 31 formed by the above-described process is cleaved, assembled as a module, and mounted to thereby complete the semiconductor laser device.

Figure 9:
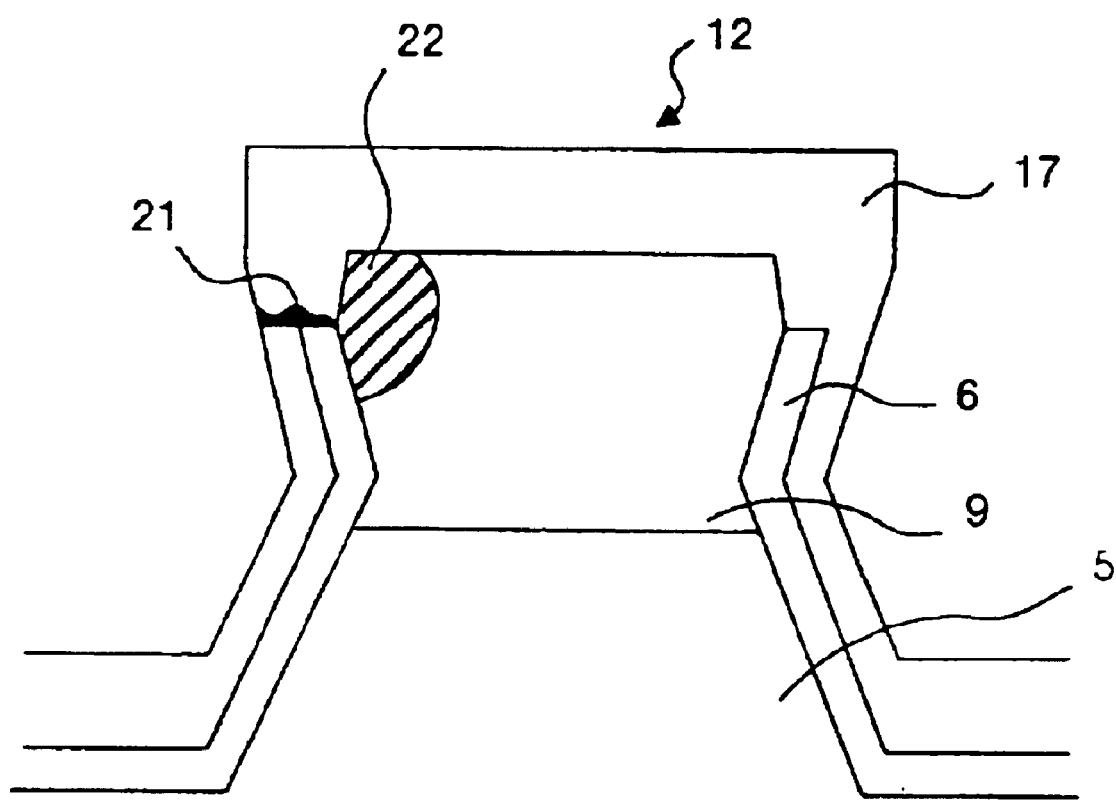
FIG. 9 is a sectional view showing erosion of the contact layer and crack in the positive electrode of a semiconductor laser according to the first invention of the present application which can benefit from the second invention according to the present application.

Thus, according to one aspect of the second invention of the present application, the positive electrode 7 has substantially the same thickness on the upper face and on the side face of the ridge 12 (by substantially the same thickness, we mean that the two thicknesses are within 10% of one another). In this particular example, a 200 nm thick positive electrode 7 is formed on the side faces and the upper face of the ridge 12. The inventors have generally found that a thickness of 150 nm or more for electrode layer 7 on the side face (denoted as thickness $T_1$ in FIG. 4C) is sufficient for preventing the formation of cracks in electrode 7 at the boundary between electrode 7 and insulating layer 6, and for preventing the erosion of the contact layer 9. FIG. 9 shows a case where the thickness $T_1$ is significantly below this value, and where the formation of crack 21 and erosion of area 22 have occurred. As a special note to the exemplary ridge 12 shown in FIG. 9, the reverse mesa form of the upper section 42 of ridge 12 causes mechanical stress to be concentrated on this upper section, which in turn causes a distortion on the positive electrode 17 on the side of the ridge 12, to thereby cause the crack 21. The use of a value of 150 nm or more for thickness $T_1$ effectively counters this stress and distortion.

Further Advantages of the Ridge with a Reverse Mesa Top Section

Figure 8:
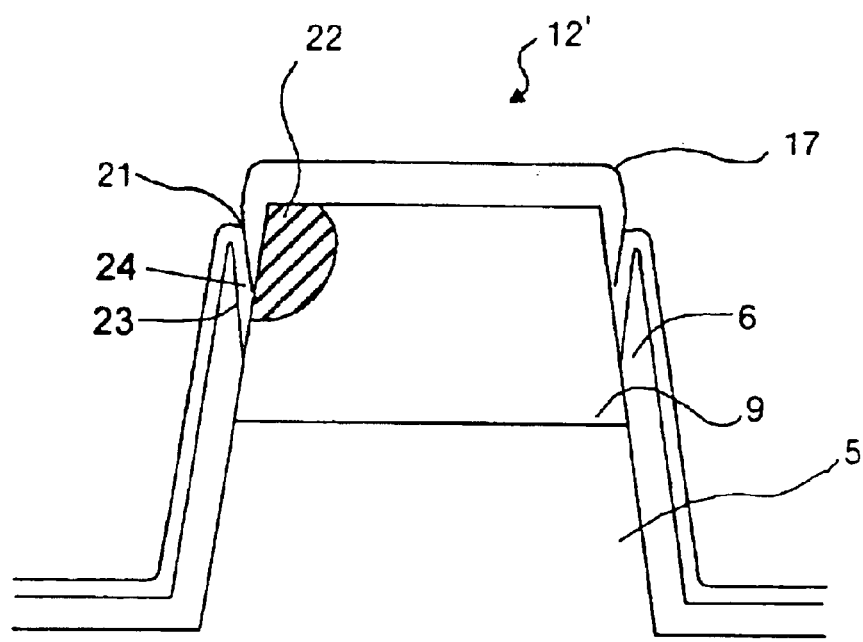
FIG. 8 is a sectional view showing erosion of the contact layer and crack in the positive electrode of the conventional semiconductor laser device according to the prior art.
Figure 6A:
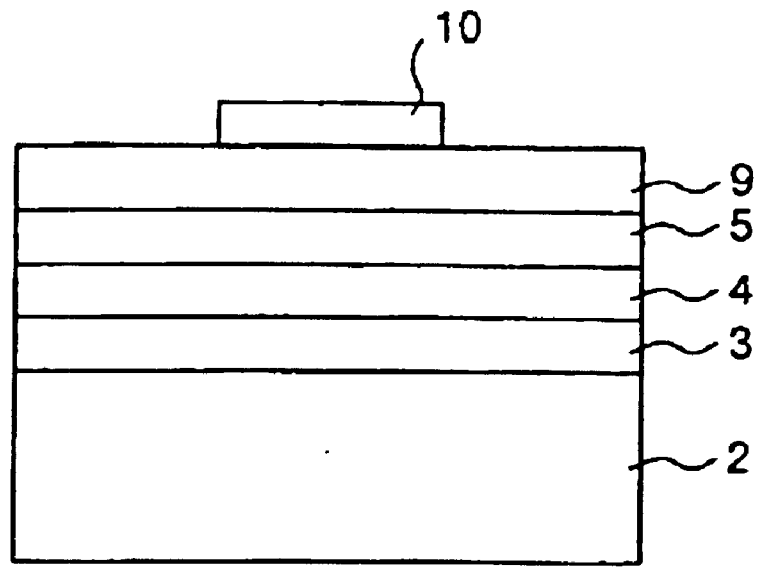
FIG. 6A to FIG. 6C are sectional views showing the manufacturing process of the semiconductor laser device shown in FIG. 5 according to the prior art.
Figure 6B:
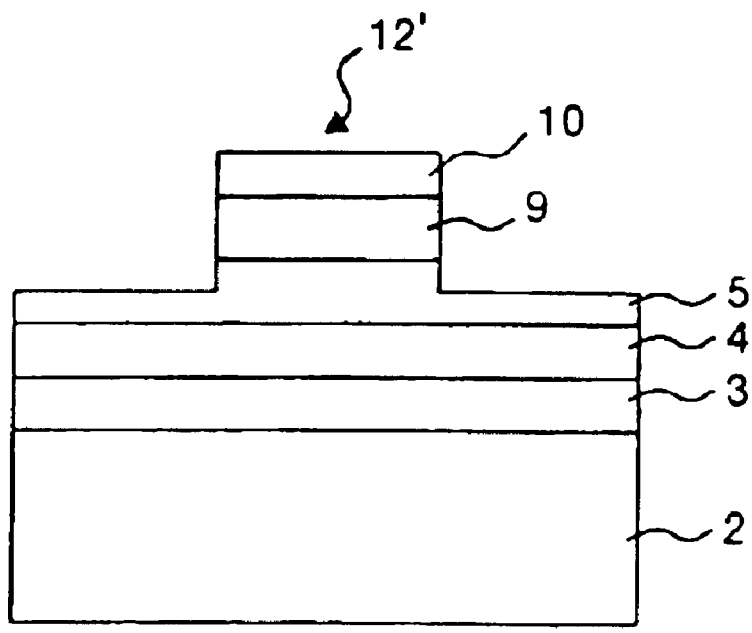
Figure 6C:
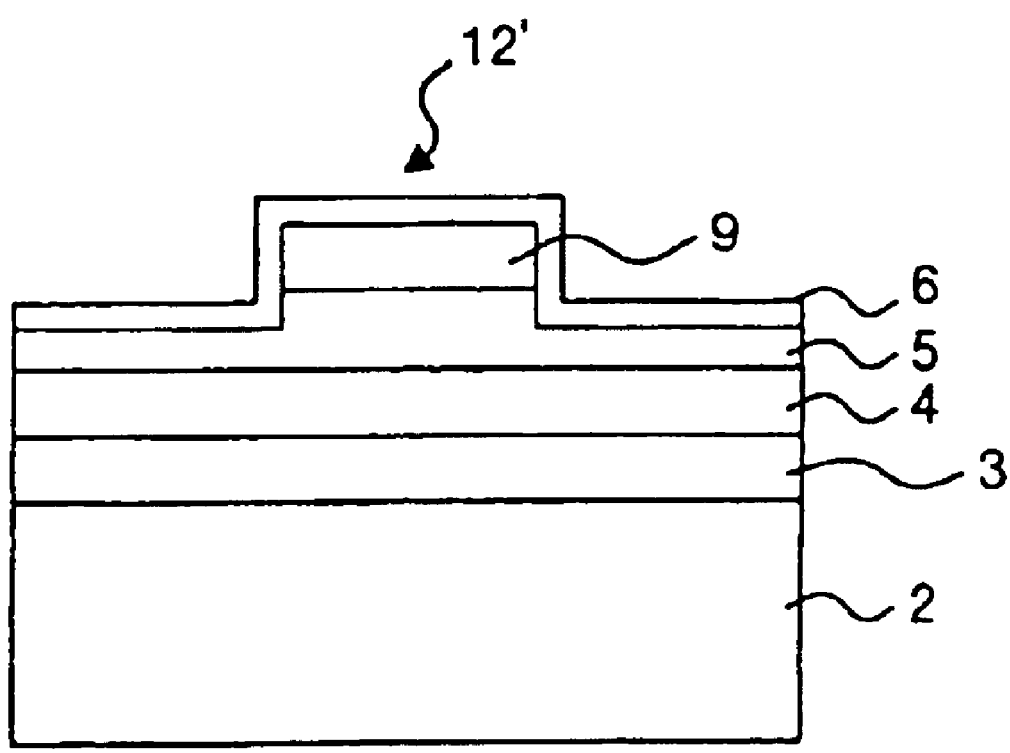
Figure 11:
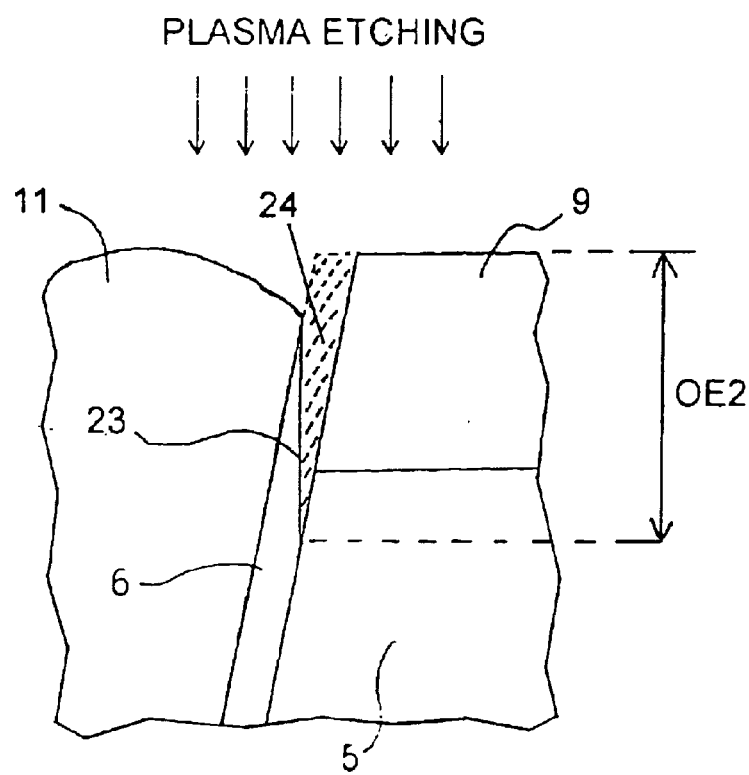
FIG. 11 is a partial sectional view of a ridge of a conventional semiconductor device after a plasma etching step according to the prior art.

As stated above, the novel shaped ridge structure shown in FIGS. 4A–4C is advantageous in reducing, and in most cases eliminating, the small gaps 24 shown in FIGS. 8 and 11 which cause discontinuities in the surface of electrode layer 7. There are further advantages related to over etching in the plasma etching processes shown in FIGS. 7C and 3C.

Figure 7A:
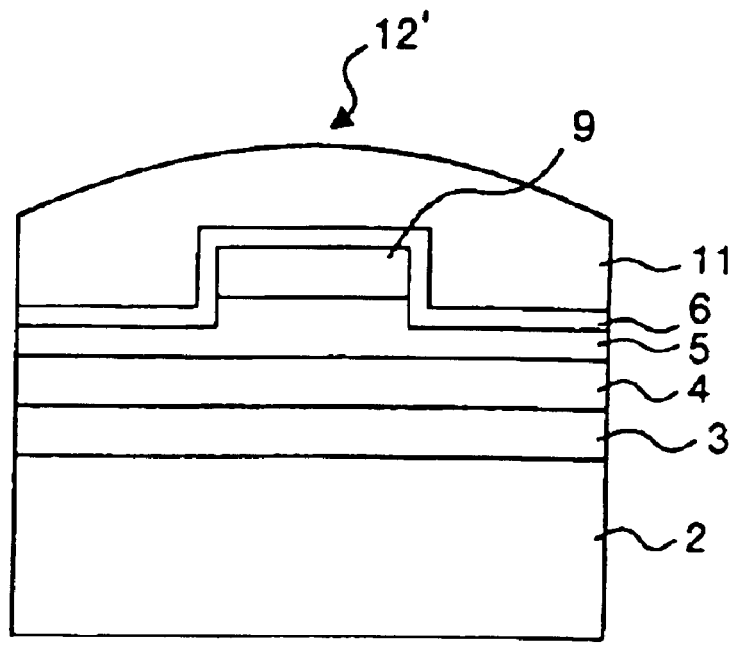
FIG. 7A to FIG. 7C are sectional views showing continuation of the manufacturing process of the semiconductor laser device shown in FIG. 5 according to the prior art.
Figure 7B:
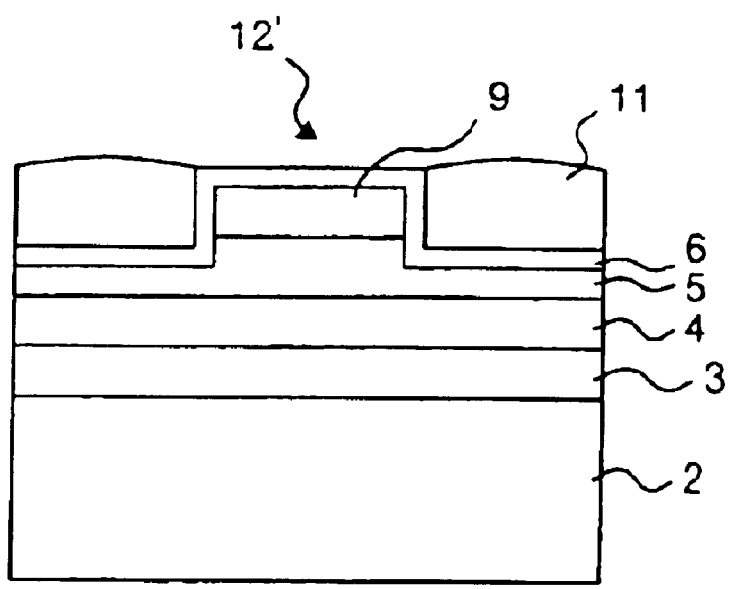
Figure 7C:
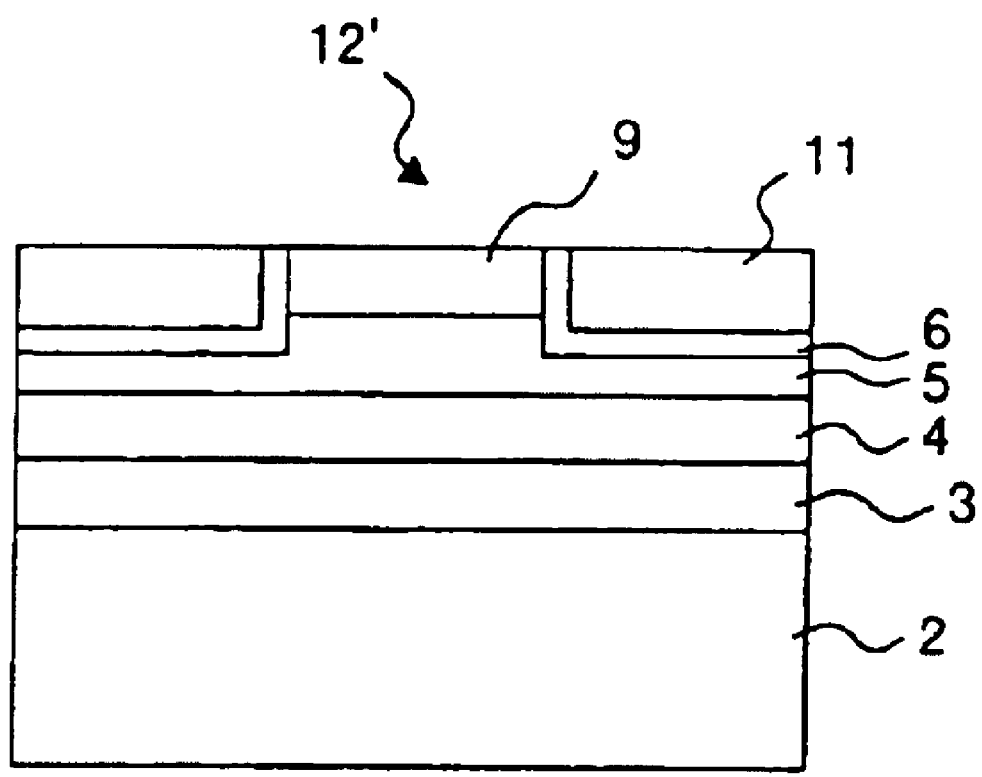

As is known in the art, the deposited thickness of resist 11 and dielectric layer 6 shown in FIG. 7A can vary to a significant degree over the surface of the wafer. As is common to the art, over etching during the plasma ashing and plasma etching steps shown in FIGS. 3B, 7B and 3C, 7C is often performed to account for such variations. In other words, the duration of the etching process is selected so that the thickest portions of these layers are completely etched, with an additional margin of time added as a safety margin. As a result, those areas where the layers are the thinnest are over etched to a large degree.

Figure 10:
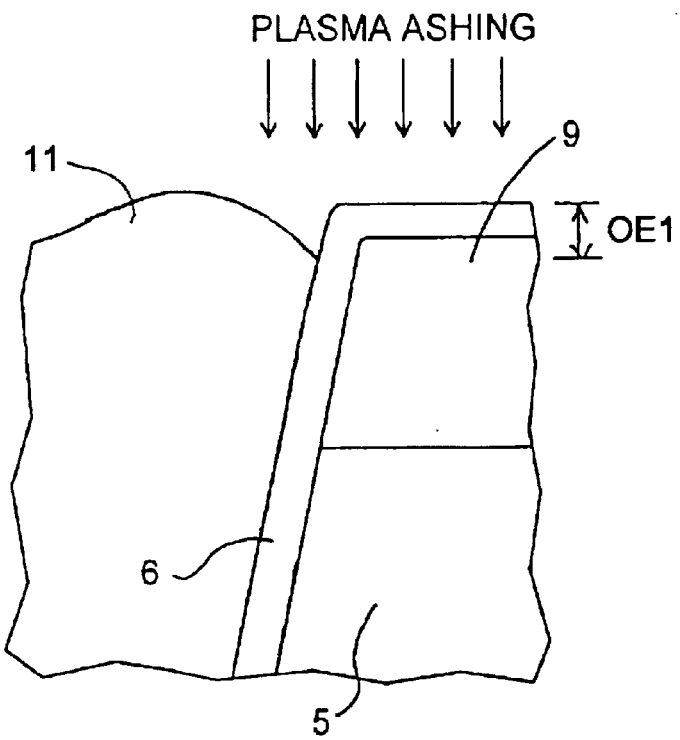
FIG. 10 is a partial sectional view of a ridge of a conventional semiconductor device after a plasma ashing step according to the prior art.

The novel shaped ridge structure of the first invention provides an additional advantage of being more resistant to over etching than the prior art forward mesa ridge. To illustrate this point, the prior art forward mesa ridge is shown in FIG. 10 after the plasma ashing step has been performed. An over etching distance OE1, as measured from the top of the ridge to the lowest point of resist layer 11, is used. The lowest point occurs next to layer 6, and exposes a part of layer 6 on the ridge's side face. FIG. 11 shows the resulting structure after the plasma etching step has been performed. A relatively long over etching time has been used, resulting in a relatively large over-etch distance OE2, as measured from the top of the ridge to the bottom of gap 24. Gap 24 is relatively deep, and uncovers sections of both layers 5 and 9 at the side faces. Because the chemical compositions of layers 5 and 9 are different, an electrochemical reaction can occur between the layers when some types of ionic photo-lithographic solutions become disposed within gap 24. The electro-chemical reaction causes an undesirable erosion of the ridge. The photo-lithographic solution can be disposed in portion of the crack 21 that extends into gap 24 (FIG. 8), during the photo-lithographic steps for defining electrodes 1 and 17. In addition, the ionic photo-lithographic solution can etch the exposed portions of layer 5 and 9 if trapped in gap 24 for a long period of time.

Figure 12:
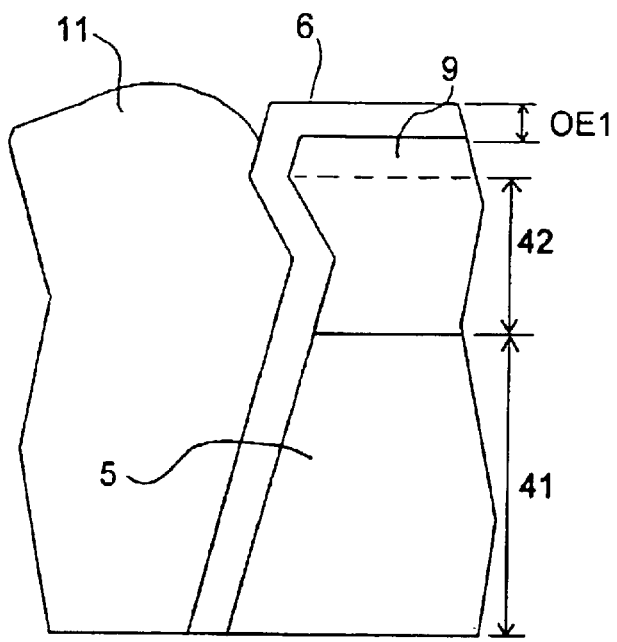
FIG. 12 is a partial sectional view of a ridge of an exemplary semiconductor device after a plasma ashing step according to the present invention.
Figure 13:
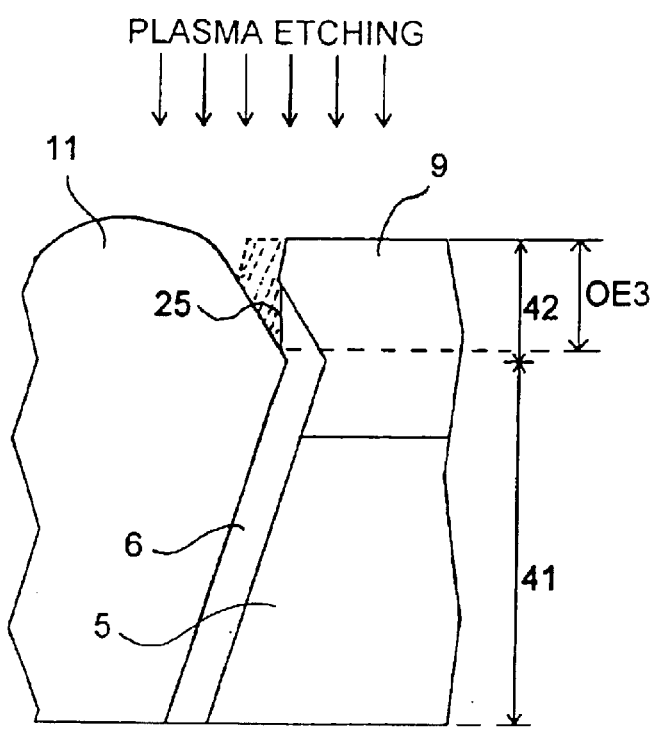
FIG. 13 is a partial sectional view of a ridge of the exemplary semiconductor device previously shown in FIG. 12 after a plasma etching step according to the present invention.
Figure 14:
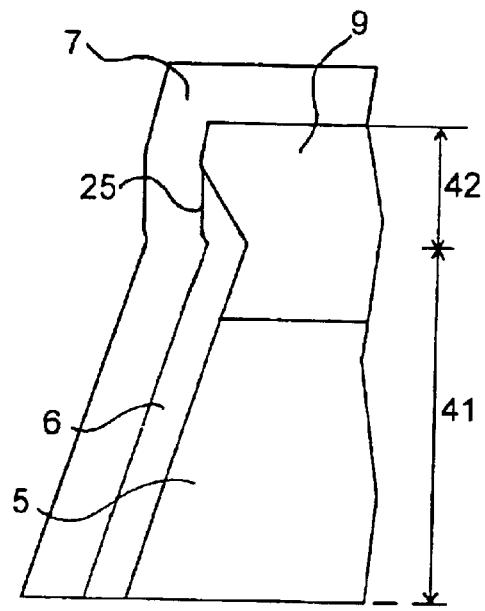
FIG. 14 is a partial sectional view of the ridge of the exemplary semiconductor device shown in FIG. 13 after the deposition of the electrode layer according to the present invention.

FIG. 12 shows an embodiment of the novel shaped ridge according to the present invention after the plasma ashing of resist layer 11. Approximately the same over etching distance OE1 has been used as that used in the prior art embodiment (FIG. 10). FIG. 13 shows the resulting structure after the plasma etching step has been performed, where an over-etching distance OE3 is obtained. Although the same over etching times has been used as in the prior art case, the value of the OE3 is significantly less than the over-etch distance OE2, as measured from the top of the ridge to the bottom of the etched area. In addition, the resulting structure does not have any gaps 24. The reverse mesa slope at the top section 42 causes the outer side of layer 6 to be etched, rather than the inner side. As a result, a relatively smooth transition is formed between the outer side of layer 6 and the side face of layer 9, which significantly reduces the occurrences of cracks 21. After reaching the etching depth of OE3, further etching of layer 6 is significantly retarded since the remainder of layer 6 is substantially protected from the plasma by layer 9. Accordingly, the novel structure provides a relatively smooth transition surface and tolerates a significant amount over-etching while maintaining the relatively smooth transition surface. In preferred embodiments, the material of layer 9 is more resistant to plasma etching than the material of dielectric layer 6. FIG. 14 shows the exemplary ridge structure after electrode 7 has been deposited, showing a relatively smooth side surface with no gaps.

Figure 15:
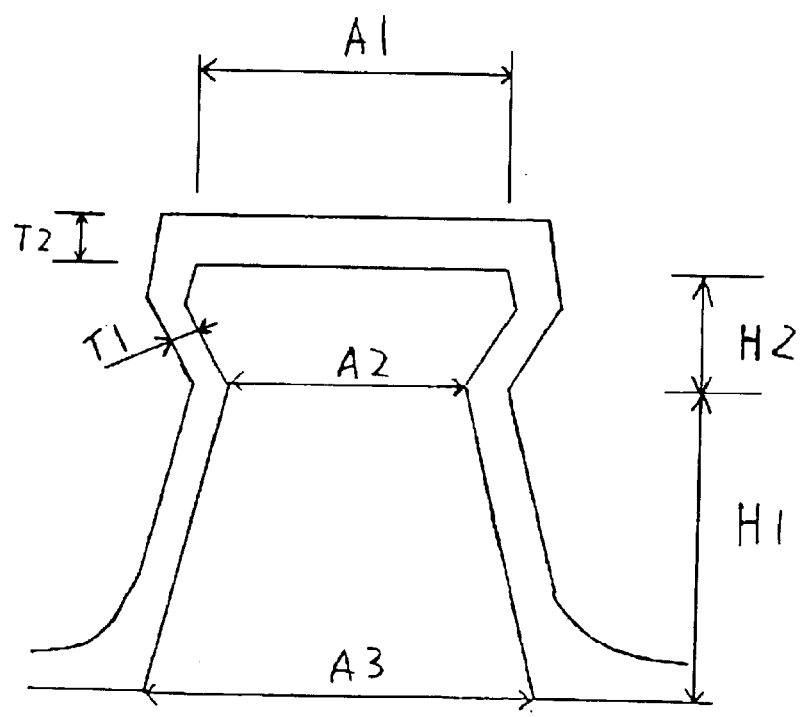
FIG. 15 is a sectional view of an exemplary ridge according to the present inventions.

Preferred dimensions of novel ridge structure according to the first invention of the present application are now described with reference to FIG. 15, which shows the definitions of the base width A3, the neck width A2, the ridge top width A1, the height H1 from the level of the base to the level of the neck point, and the height from the level of the neck point to the top of the ridge. Ridge top width A1 is preferably equal to or greater than forty percent (40%) of base width A3, and preferably less than or equal to sixty-five percent (65%) of base width A3. Neck width A2 is preferably greater than or equal to eighty percent (80%) of ridge top width A1 and less than or equal to ninety-five percent (95%) of ridge top width A1.

In one constructed preferred embodiment, A2 has value of 4 μm, A2 has a value of 1.8 μm, and A1 has a value of 2 μm. Height H2 is preferably between 0.4 μm and 0.6 μm, and more preferably substantially equal to 0.5 μm. Height H1 is preferably between 1.3 μm and 1.4 μm.

It has been mentioned above that the ridge 12 is formed by wet etching. However, the ridge 12 may be formed by dry etching.

Furthermore, a semiconductor laser device having a simple ridge stripe structure has been taken as an example in the above explanation. However, the present invention may be applied to a semiconductor laser device having a double channel structure. In the first case, the ridge 12 is formed on top of the substrate's top surface. In the second case, the ridge is formed into the top surface of the substrate by forming one or more grooves in the substrate at the top surface to define the two or more sides of the ridge. In this second case, two grooves are generally used, one on either side of the ridge, but one may use a single continuous groove which encircles the ridge.

Furthermore, a ridge-type semiconductor laser device has been taken as an example of semiconductor device in the above explanation. However, the present invention may be applied to, for example, a ridge guiding semiconductor photodetector.

Furthermore, a semiconductor laser device has been taken as an example in the above explanation. However, the present invention can be widely applied to a general semiconductor device in which a multi-layer film is simply formed into a ridge shape by an etching processing.

As explained above, according to the second invention of the present application, the positive electrode (as formed by dry deposition prior to electroplating gold) has thickness of at least 150 nm, and more preferably of at least 200 nm. Therefore, stress generated on the side of the ridge is resisted to prevent occurrence of cracks or erosion. As a result, highly precise semiconductor devices can be obtained with high yield.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:

a substrate having a top surface and a bottom surface;

a ridge formed at the top surface of the substrate and comprising at least one layer of a semiconductor material, the ridge having a base attached to the substrate, an upper face located above the base, a first body section located between the base and the upper face, a second body section located between the first body section and the upper face, and at least a first side face located between the ridge's upper face and the base and located to one side of the first and second body sections, the first side face having a first area which spans over the first body section and a second area which spans over the second body section, the first side face further having a straight mesa slope or a forward mesa slope in the first area and a reverse mesa slope in the second area;

a dielectric layer disposed on the first side face and covering the first area and at least a portion of the second area which is closest to the first area and "a layer of conductive material disposed over the dielectric layer, the upper face of the ridge, and a portion of the second area of the first side face which is closest to the upper face of the ridge."

2. The semiconductor device of claim 1, wherein the dielectric layer is disposed to cover the entire first and second areas.

3. The semiconductor device of claim 1 wherein the top surface portion of the ridge comprises a material which is more resistance to plasma etching than the material of the dielectric layer.

4. The semiconductor device of claim 1 wherein the ridge has a base width (A3) along the cross-sectional width of the base, the base width having a value in a range of 2.7 $\mu$m to 4.5 $\mu$m;

wherein the ridge has a top width (A1) along the cross-sectional width of the ridge's top face, the top width having a value in the range of forty percent of the base width to sixty-five percent of the base width;

wherein the ridge has an interface plane between the first and second body sections of the ridge, wherein the ridge has a neck width (A2) along the cross-sectional width of the ridge at the interface plane, and wherein the neck width has a value in the range of eighty percent of the ridge top width to ninety-five percent of the ridge top width.

5. The semiconductor device of claim 4 wherein the ridge has a first height (H10 from the base to the interface plane and a second height (H2) from the interface plane to the top surface of the ridge, wherein the first height has a value in the range of 1.3 $\mu$m to 1.4 $\mu$m, and wherein the second height has a value in the range of 0.4 $\mu$m to 0.6 $\mu$m.

6. The semiconductor device of claim 1 further comprising a conductive layer disposed over a portion of the first side face at a first thickness ($T_1$) and an adjacent portion of the upper face of the ridge at a second thickness ($T_2$), said first thickness being equal to or greater than fifty percent of the second thickness, said conductive layer comprises one or more sublayers, each sublayer comprising a material which has less than 5% of gold by weight.

7. The semiconductor device of claim 6 wherein said first thickness is greater than or equal to 150 nm.

8. The semiconductor device of claim 6 wherein the first thickness is less than or equal to one-hundred and twenty percent of the second thickness.

9. The semiconductor device according to claim 6, wherein the first thickness is equal to or greater than sixty percent of the second thickness.

10. The semiconductor device according to claim 9, wherein the first thickness is less than or equal to said second thickness.

11. The semiconductor device according to claim 6, wherein said first thickness is substantially equal to said second thickness.

12. The semiconductor device of claim 1 further comprising a conductive layer disposed over a portion of the first side face at a first thickness ($T_1$) and an adjacent portion of the upper face of the ridge at a second thickness ($T_2$), said first thickness is greater than or equal to 150 nm, said conductive layer comprises one or more sublayers, each sublayer comprising a material which has less than 5% of gold by weight.

* * * * *